United States Patent
Abuhamdeh et al.

(10) Patent No.: US 7,355,380 B2
(45) Date of Patent: Apr. 8, 2008

(54) METHODS AND APPARATUS FOR TESTING DELAY LOCKED LOOPS AND CLOCK SKEW

(75) Inventors: Zahi S. Abuhamdeh, Billerica, MA (US); Vincent D'Alessandro, Burlington, MA (US)

(73) Assignee: TranSwitch Corporation, Shelton, CT (US)

(*) Notice: Subject to any disclaimer, the term of this patent is extended or adjusted under 35 U.S.C. 154(b) by 0 days.

(21) Appl. No.: 11/419,375

(22) Filed: May 19, 2006

(65) Prior Publication Data
US 2007/0285080 A1  Dec. 13, 2007

(51) Int. Cl.
- G01R 23/175 (2006.01)
- G01R 23/12 (2006.01)
- H03L 7/06 (2006.01)

(52) U.S. Cl. .................. 324/76.54; 324/76.53; 324/76.35; 327/158

(58) Field of Classification Search .......... 324/76.35, 324/76.53, 76.54; 327/158
See application file for complete search history.

(56) References Cited

U.S. PATENT DOCUMENTS

| | | | |
|---|---|---|---|
| 6,815,986 B2* | 11/2004 | Roy et al. ............ | 327/149 |
| 7,075,285 B2* | 7/2006 | Chin .................. | 324/76.54 |
| 2004/0183559 A1* | 9/2004 | Ware et al. .......... | 324/763 |
| 2007/0001661 A1* | 1/2007 | Loke et al. .......... | 324/76.53 |
| 2007/0096785 A1* | 5/2007 | Maeda ............... | 327/158 |

OTHER PUBLICATIONS

"How to Use DDR SDRAM" User Manual, Document No. E0234E30 (Ver.3.0) Published Apr. 2002 (K) Japan, Elpida Memory, Inc.

* cited by examiner

Primary Examiner—Andrew H. Hirshfeld
Assistant Examiner—Amy He
(74) Attorney, Agent, or Firm—Gordon & Jacobson, PC

(57) ABSTRACT

According to the methods of the invention, a further delayed DLL signal is compared to the reference clock and a delayed reference clock signal is compared to a DLL signal. These two comparisons are performed on the 360° signal and on the 180° signal. The delay introduced by the methods of the invention is preferably adjustable based on the results of a process monitor test. The process monitor test can be run continuously and accounts for process, voltage and temperature. The methods of the invention can also be used to test for clock skew in a clock tree on a chip.

9 Claims, 10 Drawing Sheets

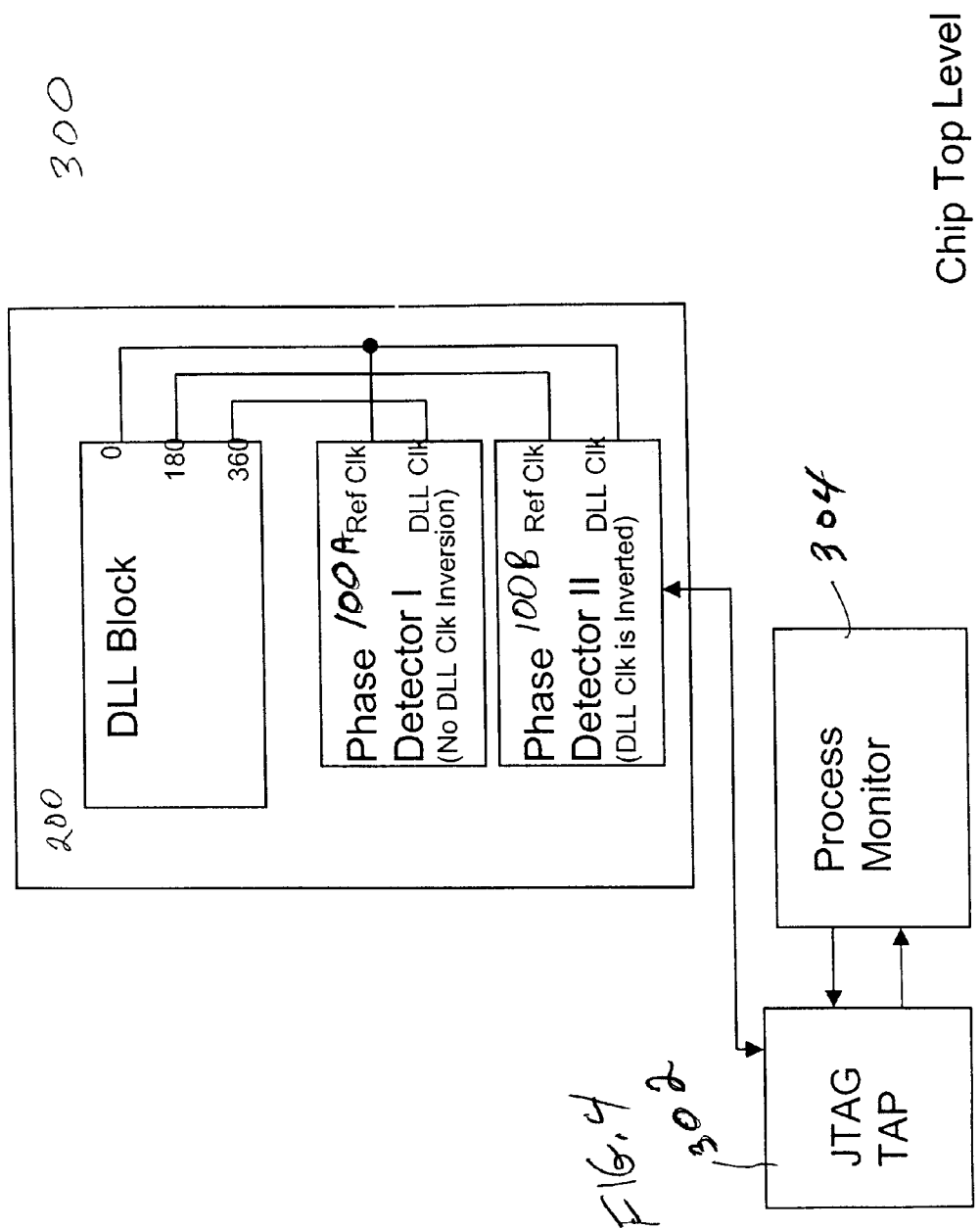

Example RING Counter Behavior for 2 TCK Clock Counts

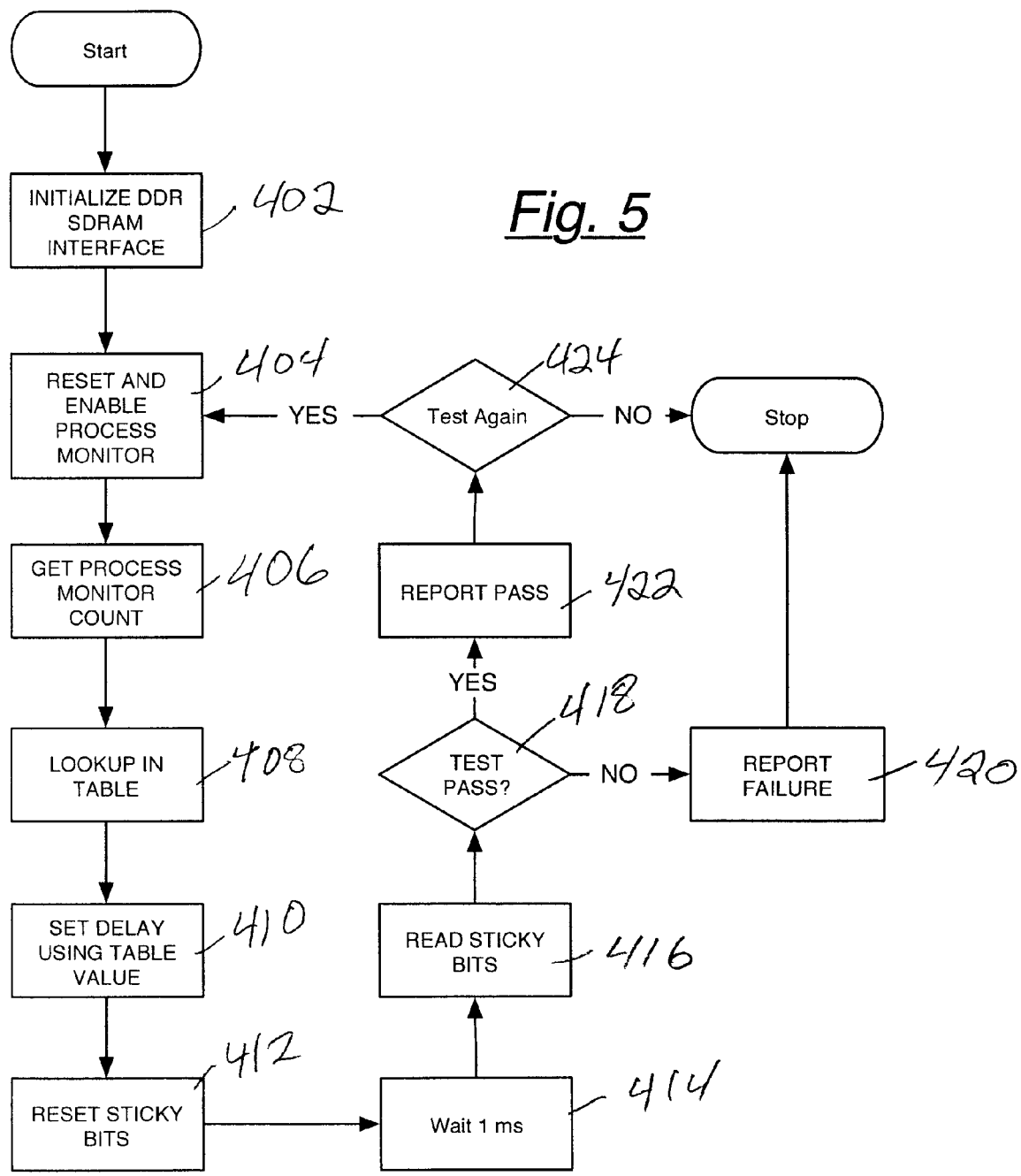

METHODS AND APPARATUS FOR TESTING DELAY LOCKED LOOPS AND CLOCK SKEW

BACKGROUND OF THE INVENTION

1. Field of the Invention

This invention relates broadly to clock skew. More particularly, this invention relates to testing the accuracy of Delay Locked Loops (DLLs) used in Double Data Rate (DDR) Synchronous Dynamic Random Access Memory (SDRAM) interfaces.

2. State of the Art

DDR SDRAM is used in a wide variety of applications including high speed telecommunications. This type of SDRAM achieves double the bandwidth of conventional SDRAM by transferring data on both the rising and failing edges of a clock signal. A typical DDR SDRAM transfers eight bytes at each transfer. Thus, a DDR SDRAM running at 100 MHz has a transfer bandwidth of approximately 1.6 GB per second. In order to function correctly, the data and clock edges must be precisely aligned. This alignment is achieved with a DLL together with a PLL (Phase Locked Loop) in the DDR memory interface.

A DLL is similar to a PLL (Phase Locked Loop) but without an oscillator. It can be used to change the phase of a clock signal. A DLL includes a chain of delay gates. The number of gates determines how much the phase of the input clock signal is changed. For a DDR SDRAM, the DLL performs a 90° and 270° phase shift. The first memory access is performed on the 90° clock edge and the second is performed on the 270° clock edge. If the phase difference is not accurate, data transfer to/from the SDRAM will fail.

Memory interfaces including DLLs are often part of a larger more complex circuit on a single CMOS semiconductor chip. The amount of delay in a CMOS cell is affected by the fabrication process, operating voltage and temperature and a fault in a DLL can render the entire chip useless. Unfortunately, DLL circuits are very difficult to test because the signals between the delay elements are essentially the same, just delayed. Thus, conventional structural testing via scan chains cannot distinguish between certain failures, like a short between outputs of delay elements that would not result in 180/360 degree phases. This is also true for clock trees which are meant to generate multiple clocks of the same phase all over a chip. Current testing solutions rely on a sliding window sampling technique to extract jitter characteristics. While these techniques are accurate, they are elaborate. A simpler test would be desirable.

SUMMARY OF THE INVENTION

It is therefore an object of the invention to provide methods and apparatus for testing a DLL.

It is another object of the invention to provide simplified methods and apparatus for testing a DLL.

It is a further object of the invention to provide apparatus for testing a DLL which is on the same chip as the DLL.

It is also an object of the invention to provide methods and apparatus for testing a DLL which uses a minimum amount of hardware.

It is an additional object of the invention to provide methods and apparatus for testing a DLL which can be accessed on a chip via a standard test interface.

It is still another object of the invention to provide methods and apparatus for testing a DLL which compensates for process, voltage and temperature.

In accord with these objects, which will be discussed in detail below, a DLL to be tested generates a 360° delay output and taps off 90°, 180°, and 270° delay outputs based on a reference clock input. According to the methods of the invention, a further delayed DLL signal is compared to the reference clock and a delayed reference clock signal is compared to a DLL signal. These two comparisons are performed on the 360° signal and on the 180° signal. The reason for choosing the 360° and 180° signals is that they can easily be compared to the reference clock using flip flops which produce a pass fail binary output. The delay introduced by the methods of the invention is preferably adjustable based on the results of a process monitor test. The process monitor test can be run continuously and accounts for process, voltage and temperature.

A test circuit according to the invention utilizes the 360° output and an inverted 180° output as well as the reference clock and tests that the DLL signals are one half and one full clock cycle from the reference clock signal. The circuit compares the edge placements via phase detection. Each of the DLL signals (360° and inverted 180°) is compared to the reference clock using two flip flops. One flip flop (FF) detects the leading edge and the other detects the lagging edge.

In the case of the Leading Edge Detector FF, the DLL output is delayed by a small amount and is sent to the data pin of the FF and the reference clock is sent to the clock pin of the FF. If the DLL clock is earlier than the reference clock by an amount equivalent to the delay introduced by the test circuit, then the FF will output a logic 0. If the DLL clock is later than the reference clock, then the FF will output a logic 1.

In the case of the Lagging Edge Detector FF, the DLL output is sent (undelayed) to the data pin of the FF, and the reference clock, slightly delayed, is sent to the clock pin of the FF. This allows the DLL clock to trail the reference clock by an amount equivalent to the delay introduced by the circuit. Based on the outputs of the FFs, it can be determined whether the DLL signal is valid or out of lock.

The amount of delay introduced by the test circuit is based on the FF setup and hold times as well as a detection window. The detection window is based in part on process, voltage and temperature. A larger delay is used for the 180° signal to account for any duty cycle distortions that are caused by the DLL. Typical delays are on the order of 200-300 picoseconds. According to a preferred embodiment, the DLL out of lock states can be registered continually into a sticky register.

According to the presently preferred embodiment, the delay introduced by the test circuit is adjustable through fifteen values (stages) which are selectable via a standard JTAG (joint test action group) TAP (test access port). This adjustable delay can be adjusted to compensate for silicon process variations, voltage and temperature.

According to the invention, a process monitor (composed of a ring oscillator and a counter) is provided on chip and coupled to the TAP. Software is provided to read the output of the process monitor and adjust the delay accordingly.

The circuit of the invention can also be used to test for clock skew in a clock tree on a chip. Points on the tree where the most skew would be expected are coupled to the respective reference and 360° inputs of the circuit.

Additional objects and advantages of the invention will become apparent to those skilled in the art upon reference to the detailed description taken in conjunction with the provided figures.

BRIEF DESCRIPTION OF THE DRAWINGS

FIG. 2 is a high level schematic block diagram illustrating a portion of the presently preferred embodiment of the invention;

FIG. 4 is a high level schematic block diagram illustrating the presently preferred embodiment with a JTAG TAP interface coupled to a process monitor;

FIG. 5 is a high level flow chart illustrating the operation of the process monitor.

DETAILED DESCRIPTION

Figure 1:
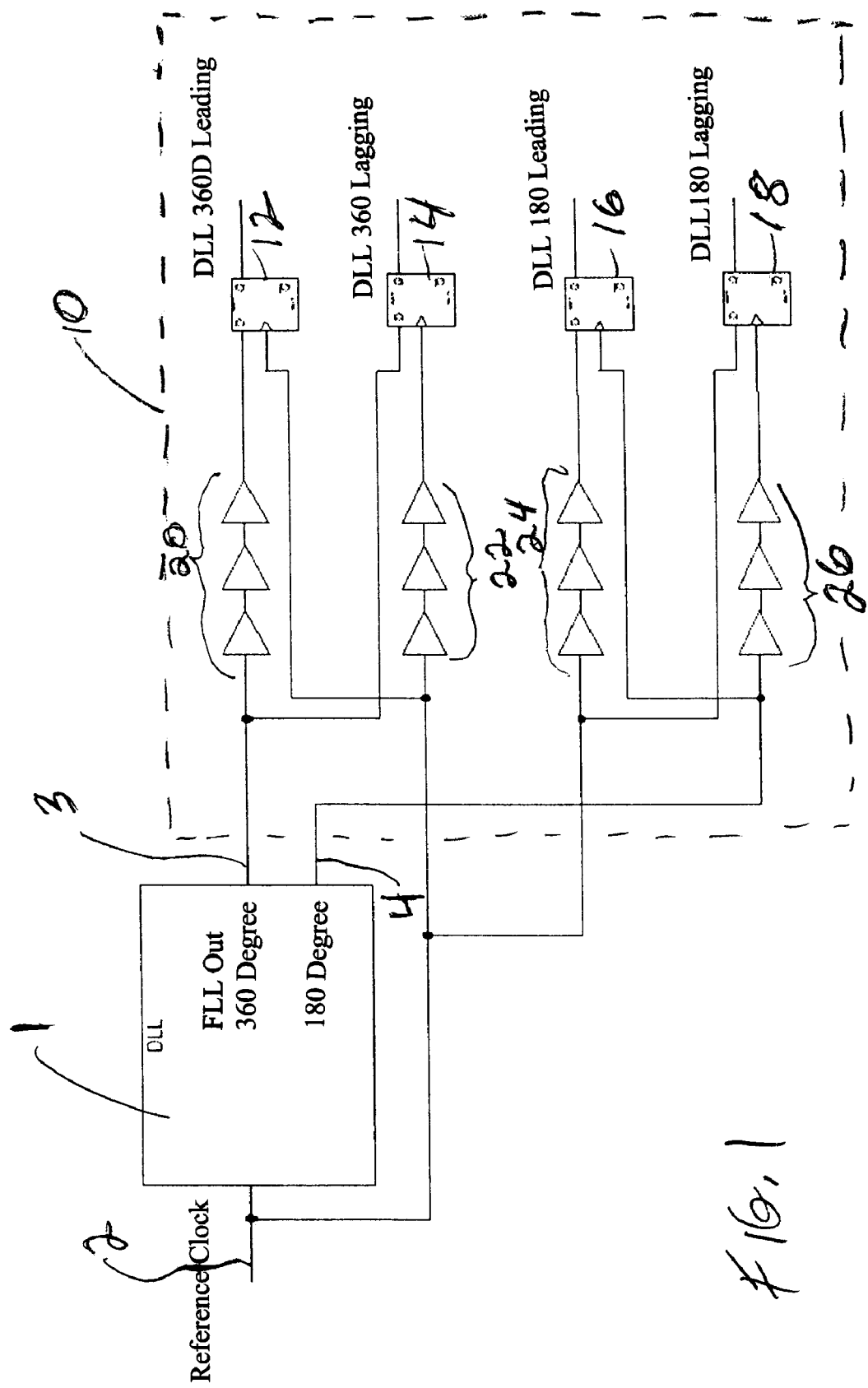
FIG. 1 is a high level schematic block diagram illustrating the central concepts of the invention.

Turning now to FIG. 1, a test circuit 10 according to the invention is used to test a DLL 1 coupled to a reference clock 2 and producing a 360° delayed signal 3 as well as a 180° delayed signal 4. The circuit 10 includes four flip flops 12, 14, 16, 18, and four delay lines 20, 22, 24, 26. The 360° signal is tested by flip flops 12 and 14 while the 180° signal is tested by flip flops 16 and 18.

More particularly, the 360° signal is delayed by delay line 20 and the delayed signal is provided to the data input of flip flop 12 whereas the reference clock signal 2 is coupled without any delay line to the clock input of the flip flop 12. The 360° signal is also coupled without a delay line to the data input of flip flop 14 and the reference clock signal 2 is delayed by the delay line 22 and the delayed signal is provided to the clock input of flip flop 14.

The 180° signal is inverted by connecting it to the clock input of flip flop 16. The reference clock signal 2 is delayed by delay line 24 and the delayed signal is coupled to the data input of flip flop 16. The 180° signal is delayed by the delay line 26 and the delayed signal is inverted by coupling it to the clock input of the flip flop 18 and the reference clock 2 is coupled without a delay line to the data input of flip flop 18.

As described in more detail below, the delay imposed by the delay lines 20, 22, 24, 26 is based in part on process, voltage and temperature. If the delay lines are properly set, the outputs of the flip flops are indicated in Table 1 below. It will be appreciated that logically the delay lines 22 and 24 are redundant. However, it is actually easier as a matter of manufacturing process to make two separate delay lines 22 and 24.

TABLE 1

| Flip Flop 12 | Flip Flop 14 | Flip Flop 16 | Flip Flop 18 | DLL Status |
|---|---|---|---|---|
| 0 | 1 | 1 | 0 | Valid |
| 1 | 0 | 0 | 1 | Error |

TABLE 1-continued

| Flip Flop 12 | Flip Flop 14 | Flip Flop 16 | Flip Flop 18 | DLL Status |
|---|---|---|---|---|
| 0 | 0 | 1 | 1 | Out of lock |
| 1 | 1 | 0 | 0 | Out of lock |

The minimum phase delay for the delay lines 20, 22, 24, 26 in order to make the circuit work as shown in Table 1 is expressed in Equation 1.

$$PhaseDelay_{min} = 1.05 \left( FF_{setup} + FF_{hold} + \frac{Jitter}{2} \right) \quad (1)$$

$FF_{setup}$ is typically 100 ps and $FF_{hold}$ is typically 40 ps. The reference clock cycle to cycle jitter is about ±100 ps and the DLL output cycle to cycle jitter is also about ±130 ps. Half the total Jitter is therefore 230 ps. Adding in the $FF_{setup}$ and $FF_{hold}$ yields 370 ps. 105% of 370 ps yields a minimum phase delay of 388 ps. The phase detection window is the total of leading and lagging phase delay and is thus two times the phase delay determined by Equation 1 or 776 ps which is rounded up to 780 ps. For the 180° signal there is an 80 ps duty cycle distortion, resulting in a detection window of 860 ps. With the foregoing information, Equation 1 can be applied to obtain a minimum phase delay of 780 ps for delay lines 20 and 22, and 860 ps for delay lines 24 and 26.

Figure 1A:
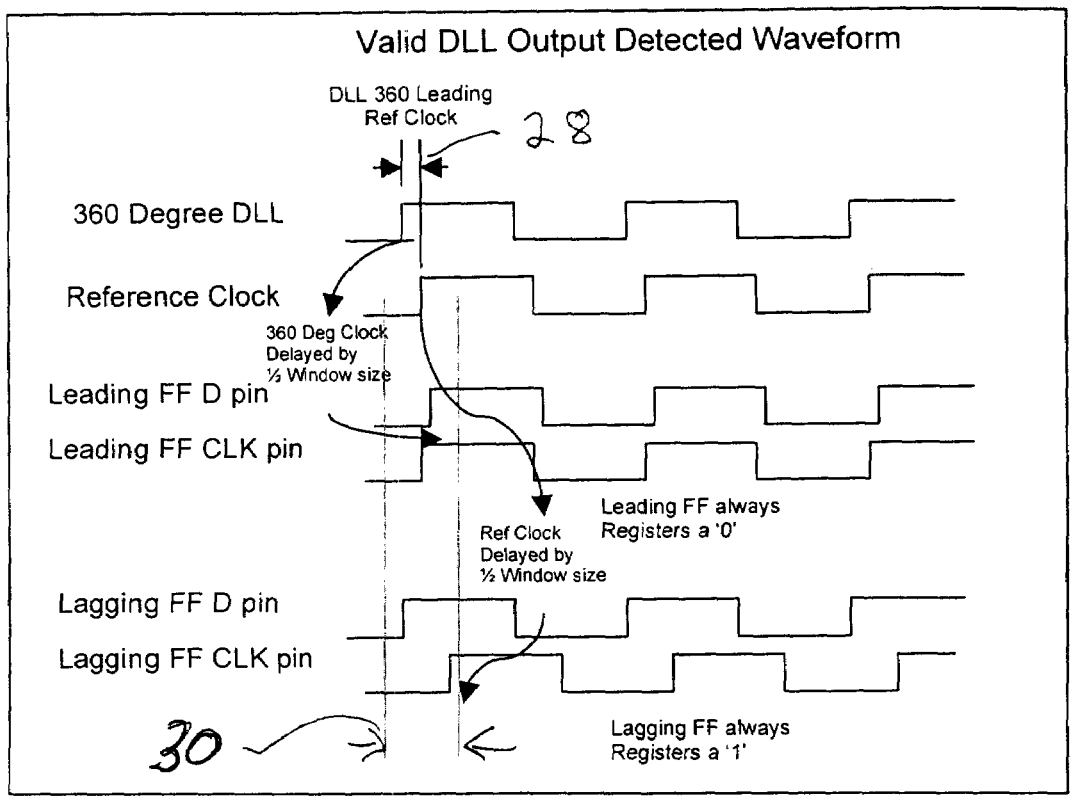
FIG. 1A is an exemplary timing diagram illustrating the 360° clock comparison.

As shown in FIG. 1A, the 360° DLL clock is not aligned with the reference clock as it should be. It is lagging by the amount shown at 28. The window labeled 30 in FIG. 1A is the permissible phase error for the 360° DLL clock. The D input of the leading flip flop (12 in FIG. 1) trails the clock input of the flip flop by the amount of delay added by the test circuit plus or minus the error in phase imposed by the imperfect DLL circuit. Similarly, the clock input of the lagging flip flop (14 in FIG. 1) trails the D input by the amount of delay added by the test circuit plus or minus the error in phase imposed by the imperfect DLL circuit. With the clock signals shown in FIG. 1A being within allowable tolerance, the output of the flip flop 12 will always be zero and the output of the flip flop 14 will always be one.

Figure 1B:
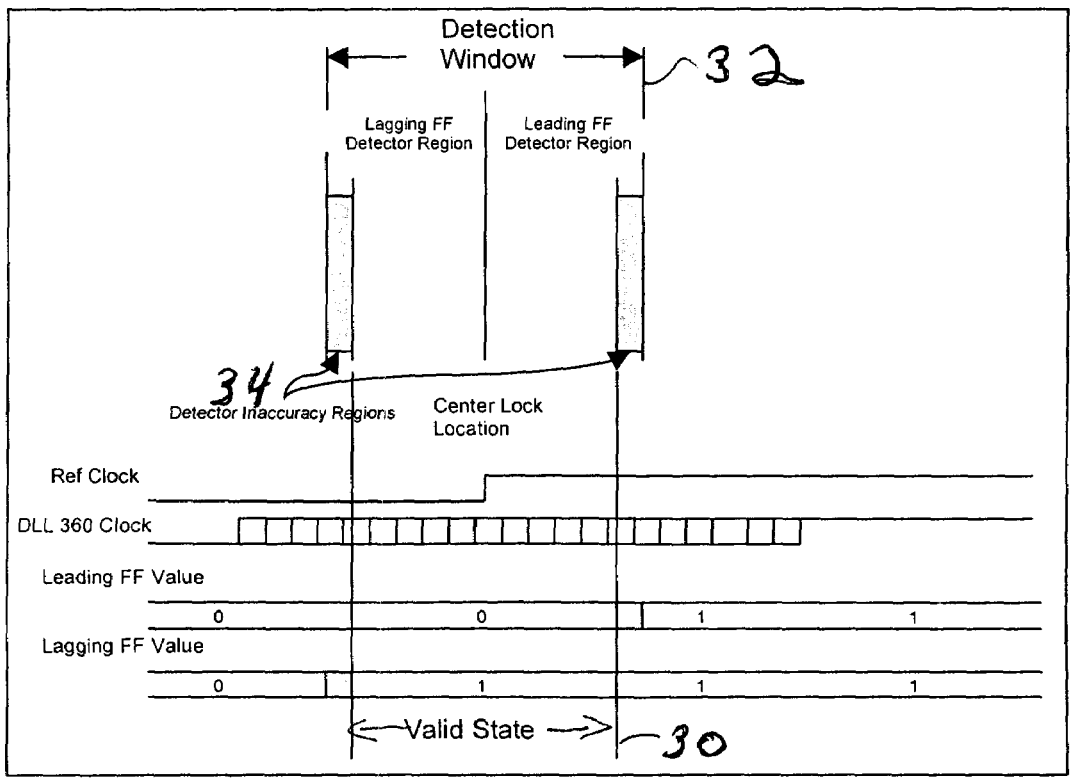
FIG. 1B is an enlarged view of a portion of FIG. 1A.

FIG. 1B shows how the detection window 32 relates to variations in the DLL 3600 clock signal. The multiple rising and failing edges of the DLL 3600 clock signal indicate all of the different places where the rising edge could be depending on process, voltage and temperature. The grayed areas 34 illustrate the inaccuracy regions which were calculated as the setup and hold times for the flip flops.

Turning now to FIG. 2, the circuit 100 is similar to the 360° part of circuit 10 with similar parts having similar reference numerals (increased by 100). In this circuit two features have been added. The first is the adjustability of the delay lines 120 and 122 and the second is the sticky outputs produced by flip flops 113 and 119.

The adjustable delay line 120 includes fifteen delay elements 121-1 through 121-15 (only five are shown in FIG. 2 to save space) and fifteen 2:1 multiplexers 123-1 through 123-15. The output of each delay element is coupled to one input of a 2:1 multiplexer. The output of each of the first fourteen multiplexers is coupled to the next delay element and to the other input of the next multiplexer. The DLL signal 3 is coupled to the first delay element 121-1 and the other input of the first multiplexer 123-1. The output of the last multiplexer 123-15 is coupled to the data input of the flip flop 112. The select input of each multiplexer is coupled to one of the outputs of a four bit decoder 125. Those skilled in the art will appreciate that the input to the decoder 125 will determine how many delay elements will be used. For example, an input of 0000 will select no delay elements and an input of 1111 will select all fifteen delay elements. The delay line 122 is similarly arranged. The additional multiplexers and wiring in the lines which are not delayed are to account for the delay imposed by the wiring and multiplexers in the delay line so that the difference in delay between the delayed signal and the non-delayed signal is only due to the delay elements.

The sticky output of flip flop 113 is produced by ORing at 115 its own Q output with the Q output of the flip flop 112 and producing the result to the data input of flip flop 113. The sticky output of flip flop 119 is produced by ANDing at 117 its Q output with the Q output of flip flop 114 and producing the result to the data input of flip flop 119. When the output of flip flop 112 is 0, the output of flip flop 113 sticks at 0 until reset by the signal Reset_n_gen. Similarly, when the output of flip flop 114 is 1, the flip flop 119 sticks at 1 until reset by the signal Reset_n_gen. It will be appreciated that the circuit 100 is replicated with respect to the 180° signal in a manner similar to what is shown in FIG. 1. As described in more detail below with reference to FIG. 5, the reset signal is set by software at the start of a test.

The amount of delay introduced by each delay element 121 is a function of the chip technology used and the library of devices provided by the foundry as well as the process delay discussed above. In a simulation using 0.18 μm technology, each delay element (delay buffer) provides a 60 ps delay in a best case process and 125 ps in a worst case process. Calculations for the 0.18 μm technology suggest a delay value over all operating conditions of about 400 ps and a total window size of about 780 ps.

Figure 3:
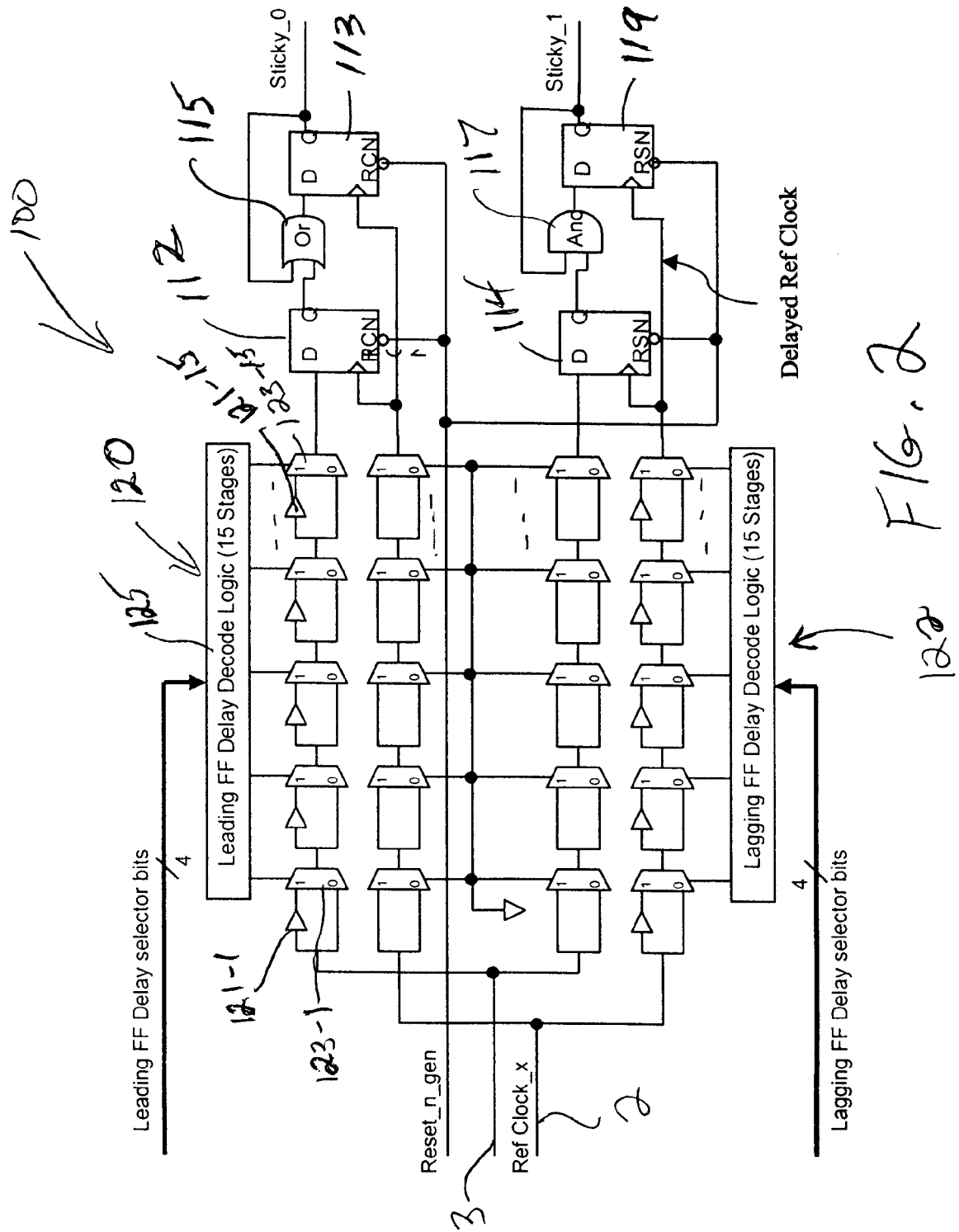
FIG. 3 is a high level schematic block diagram illustrating the presently preferred embodiment with a JTAG TAP interface.
Figure 3:
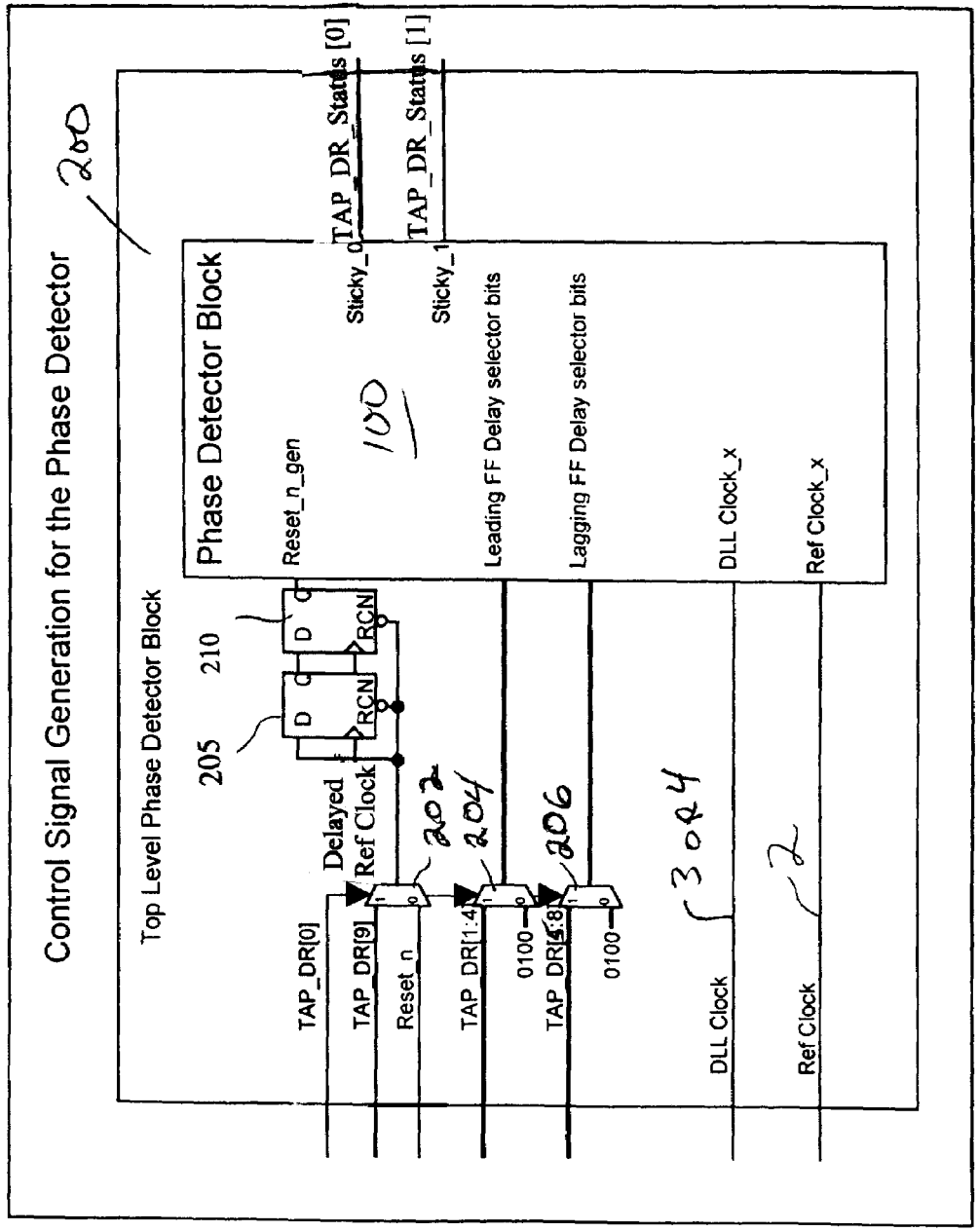

FIG. 3 illustrates how the circuit 100 is accessed via a JTAG TAP interface in order to provide the leading and lagging FF delay selector bits, to obtain the outputs of the sticky flip flops, and to reset the flip flops. Those skilled in the art will appreciate that the JTAG TAP interface includes a number of data registers (DRs) which can be used to transfer information between the chip and an external processor. The circuit 100 of FIG. 2 is located on a larger chip 200 which includes a standard JTAG TAP interface, some of which is shown in FIG. 3. For example the four bits used to select the leading edge delay can be assigned to TAP DRs 1 through 4 and the four bits used to select the lagging edge delay can be assigned to TAP DRs 5 through 8. The sticky outputs of flip flops 113 and 119 (FIG. 2) can be assigned to TAP DR_status registers 0 and 1 respectively. The circuit 200 includes three multiplexers 202, 204, 206 and two flip flops 208, 210. Each of the multiplexers is controlled by a single bit stored in the TAP data register TAP_DR[0]. When in the default mode, the value 0100 is applied to both the leading FF delay selector bits and the lagging FF delay selector bits and the Reset_n signal is applied to the flip flops 208, 210. The value 0100 will insure that the test passes under worst case process, voltage and temperature conditions and the Reset_n_gen will be common with the chip reset Reset_n. When the register TAP_DR[0] is asserted, the control of the leading FF delay selector bits and the lagging FF delay selector bits is handed over to the contents of data registers TAP_DR[1:4] and TAP_DR[5:8] and Reset_n_gen is controlled by the contents of the data register TAP_DR[9]. The two flip flops 208, 210 synchronize reset deasserting timing. When the reset pulse is removed, the clock will have to propagate the de-assertion. It goes through the two flip flops to make sure that if the first goes meta-unstable due to the Reset/clock timing relationship, the second flip flop will isolate meta stability, and still assert the reset until the second clock cycle, giving the first flip flop plenty of time to resolve its stability.

According to another aspect of the invention, a process monitor is provided on chip so that the performance of the chip in view of process, voltage and temperature can be evaluated. FIG. 4 shows a chip 300 having a DLL and phase detector block 200, a JTAG interface 302, and a process monitor 304. As described above, the DLL and phase detector block 200 includes a DLL with 0°, 180°, and 360° outputs, a 360° phase detector 100A (as in FIG. 2), and an inverted 180° phase detector 10B. The JTAG TAP 302 is coupled (via some of its registers) to the DLL and phase detector block 200 and the process monitor 304 is coupled to the JTAG TAP 302 as well. The process monitor is used to determine the leading and lagging FF delay selector bits. A suitable process monitor is illustrated in FIG. 4A.

Figure 4A:
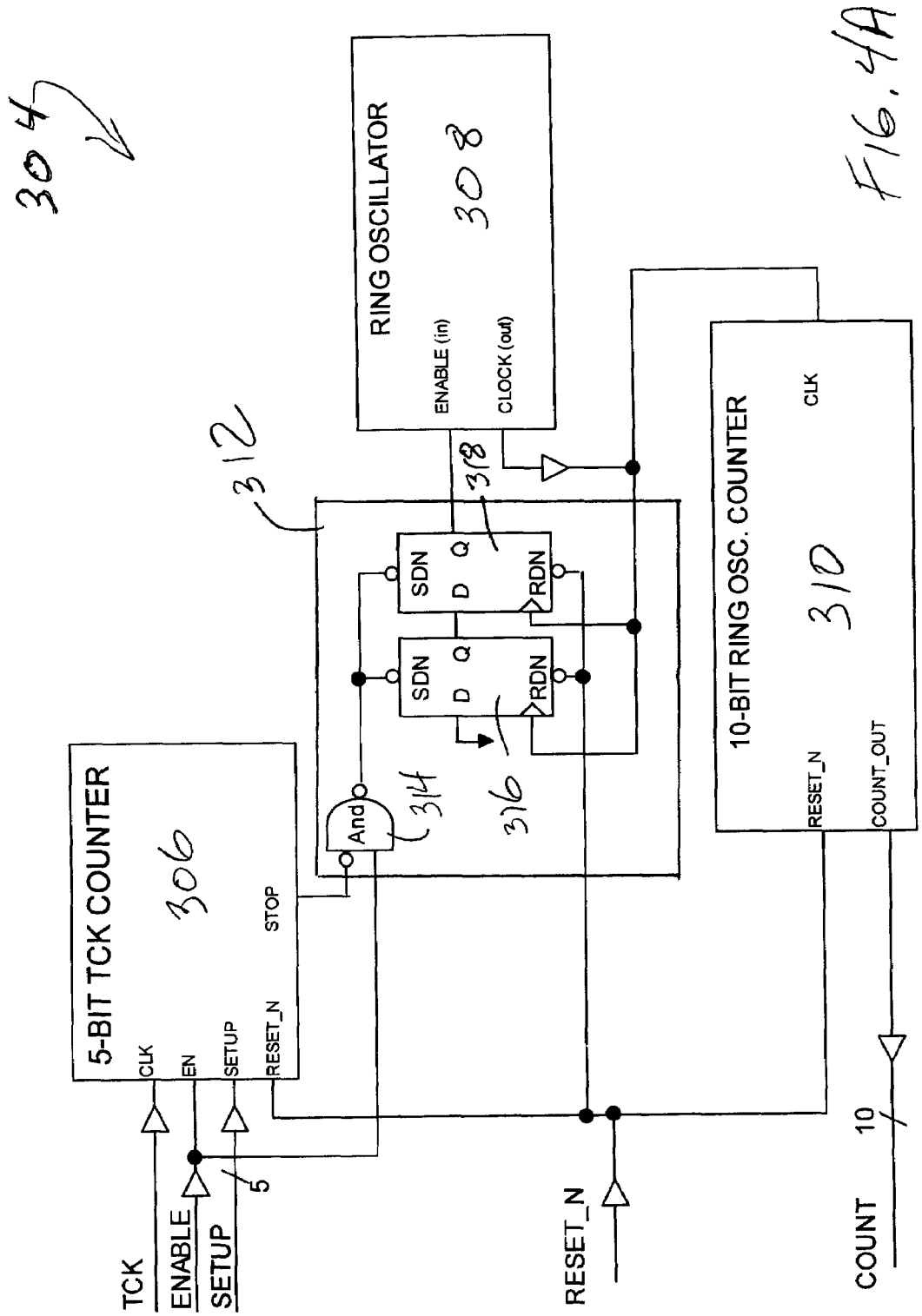
FIG. 4A is a high level schematic block diagram illustrating a process monitor according to the invention.

Turning now to FIG. 4A, the process monitor 304 is made up of four functional blocks: a 5-bit TCK counter 306, a ring oscillator 308, a 10-bit ring oscillator counter 310, and a synchronizing circuit 312.

The TCK counter 306 is a 5-bit counter that counts up to a terminal value 11111. This defines a measurement window during which the ring oscillator counter 310 is permitted to count. The counter 306 can be reset to zero via a RESET_N signal or can be loaded with a start value via the 5-bit SETUP signal. When the ENABLE signal is applied, the counter starts counting on the next TCK CLK. The SETUP value determines the measurement window for the ring oscillator 308. The maximum time is thirty-two TCK periods. When the counter reaches the terminal value, STOP is asserted on the next TCK and remains high until reset or a new SETUP value is loaded.

The synchronizing circuit 312 includes a NAND gate 314 and two D flip flops 316, 318. This asynchronously enables (in phase with TCK) the ring oscillator 308 and disables it two ring oscillator clock periods after the TCK counter has reached its terminal value as shown in FIG. 4C. When the ring oscillator is running, it drives the counter 310 which provides a count output COUNT_OUT that is ultimately used to determine the number of delay elements (FIG. 2, 121-1 ... 121-15) which should be selected. The two D flip flops 316, 318 are asynchronous set and clear. RESET_N=0 resets everything. ENABLE=1 starts counter 306 whose output 'STOP'=0. The NAND gate 314 with 'STOP' input inverted then outputs a 0 to set both D flip flops 316, 318 to 'Q'=1. This starts the ring oscillator 308. When 'STOP'=1 both D flip flops 316, 318 are allowed to function as D flip flops. On the second rising edge of the ring oscillator output a 0 is propagated to the ring oscillator ENABLE as shown in FIG. 4C synchronously stopping it. Counter 310 can then be read.

Figure 4B:
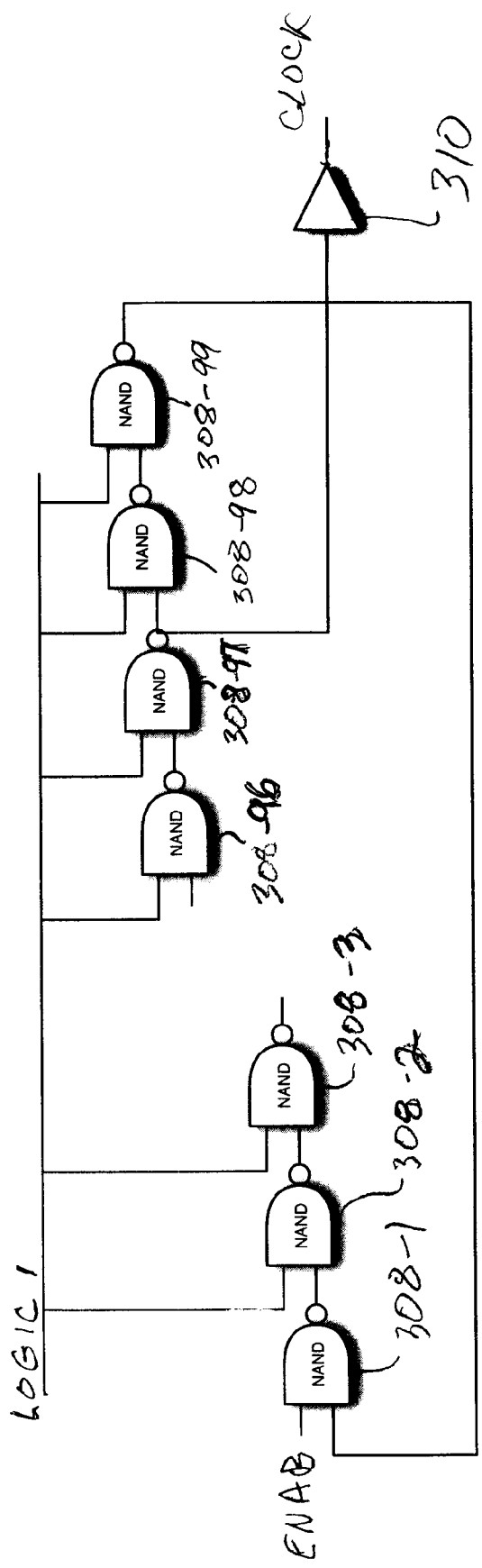
FIG. 4B is a high level block diagram of the ring oscillator of FIG. 4A.
Figure 4C:
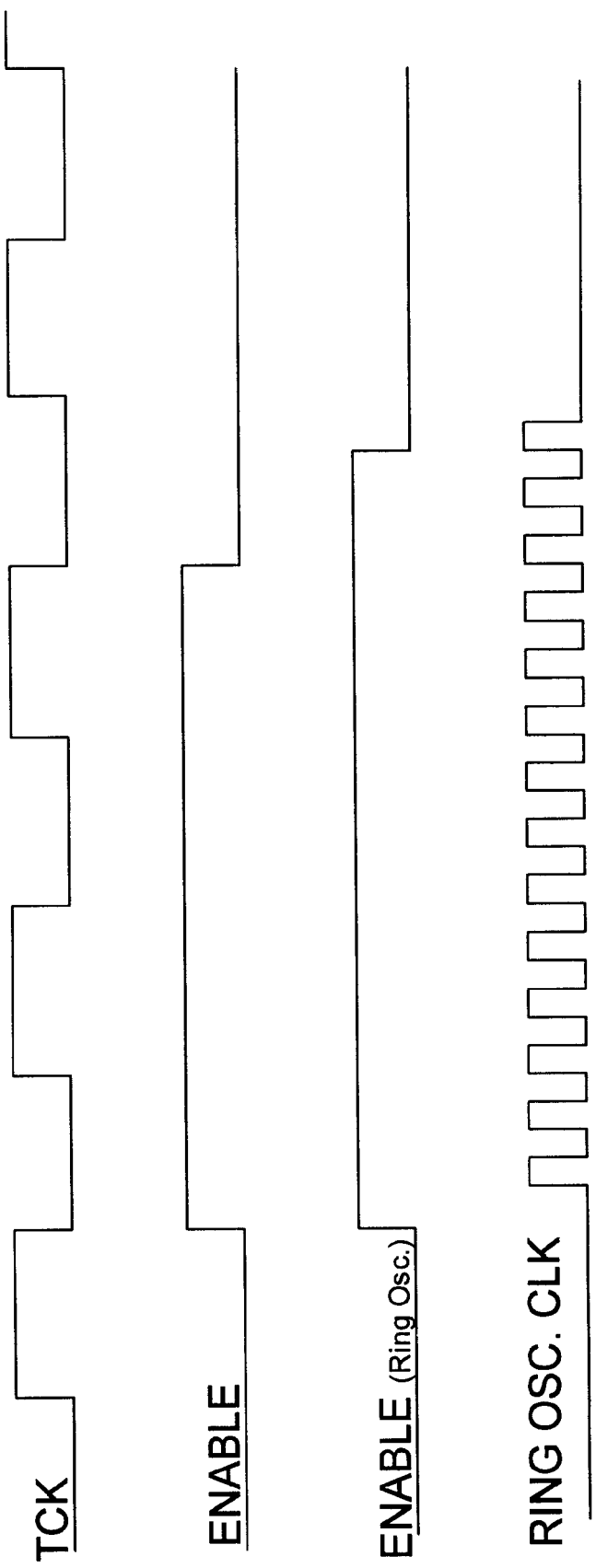
FIG. 4C is a timing diagram illustrating the signals in the circuit of FIG. 4A.

The ring oscillator 308 is preferably made from an odd number of 2-input NAND gates 308-1 through 308-99 as shown in FIG. 4B. An active high Enable signal is provided to the first gate 308-1 from the Q output of flip flop 318 (FIG. 4A). The output of each NAND gate is coupled to an input of the next in the ring and the other inputs of the NAND gates are tied to logical 1. An output buffer 310 isolates the oscillator from an output load. In an exemplary simulation, ninety-nine elements were found to provide an oscillator frequency that was high enough for sufficient count resolution across the operating range, yet low enough to allow the ripple-carry counter to still operate. Simulations of the oscillator with regard to process, voltage and temperature produced oscillation frequencies shown in Table 2 for a 0.18 micron process.

TABLE 2

| Process | Voltage | Temperature | Frequency |
|---|---|---|---|
| Best Case | 1.98 V | −40° C. | 190 MHz |
| Typical Case | 1.80 V | 25° C. | 130 MHz |
| Worst Case | 1.62 V | 125° C. | 79 MHz |

Returning to FIG. 4A, the 10-bit ring oscillator counter 310 is reset to a zero count when the TCK counter is reset and counts up as long as it receives clock pulses from the ring oscillator 308 which operates during the window defined by the TCK counter. The maximum count of the 10-bit counter is one thousand twenty-four, large enough to accommodate the expected ring counter range.

Referring now to FIGS. 4 and 4A, the count output of the process monitor 304 is the count output of the 10-bit ring oscillator counter 310 which is supplied to a data register of the JTAG TAP 302. The count produced by the 10-bit ring oscillator counter 310 is compared to a lookup table (as discussed below with reference to Table 3) to determine the number of delay stages to be used in the phase detector blocks. Based on simulations of a 0.18 μm design, the expected count range is approximately 100 to 260 which provides a granularity of 0.625%.

Software running on an external processor (not shown) which is coupled to the chip via the JTAG TAP, tests the DLL on the chip and provides a PASS/FAIL output. The amount of delay introduced by the delay lines in the test circuits is adjusted based on the output of the process monitor 304.

FIG. 5 is a high level flow chart illustrating the operation of the testing software according to the invention. The DLL and the PLL of the DDR SDRAM interface are initialized at 402. At 404, the process monitor is reset and enabled. The count is read at 406 and is looked up at 408 to obtain the leading and lagging 4-bit delay words. The delay words are sent to the decoders of the test circuit at 410 and the sticky bits are reset at 412. After a delay of 1 ms at 414, the sticky bits are read at 416. Comparing the sticky bit values to those in Table 1 described above, a determination is made at 418 whether the DLL has passed the test and is functioning correctly. If the DLL fails the test, the failure is reported at 420 and the program stops. If the DLL passes the test, a pass is reported at 422. Optionally, after reporting a pass at 422 a call for input is made at 424 as to whether the test should be repeated. It will be appreciated that the input at 424 could be read from a counter or a register.

Table 3 illustrates an example of a look up table which correlates process monitor count with number of delay stages. The table also illustrates the amount of delay introduced by each delay stage as a function of process monitor count, the fractional number of stages needed to produce the target delay, the actual delay produced by the stages and the difference between actual and target delay. Although the delay stages were implemented using fifteen stages, the example below only requires seven stages.

TABLE 3

| Process | Expected PM Count # | Target Delay ps | Delay/ Stage ps | Stages Needed # | Actual Stages # | Resulting Delay ps | Error in Delay ps |
|---|---|---|---|---|---|---|---|
| Best Case | 634 | 400 | 60.0 | 6.67 | 7 | 420.0 | 20.0 |
|  | 587 | 400 | 68.1 | 5.87 | 6 | 408.8 | 8.8 |
|  | 540 | 400 | 76.3 | 5.25 | 6 | 457.5 | 57.5 |
|  | 492 | 400 | 84.4 | 4.74 | 5 | 421.9 | 21.9 |
| Typical | 445 | 400 | 92.5 | 4.32 | 5 | 462.5 | 62.5 |
|  | 398 | 400 | 100.6 | 3.98 | 4 | 402.5 | 2.5 |
|  | 351 | 400 | 108.8 | 3.68 | 4 | 435.0 | 35.0 |
|  | 303 | 400 | 116.9 | 3.42 | 4 | 467.5 | 67.5 |
| Worst Case | 256 | 400 | 125.0 | 3.20 | 4 | 500.0 | 100.0 |

Figure 6:
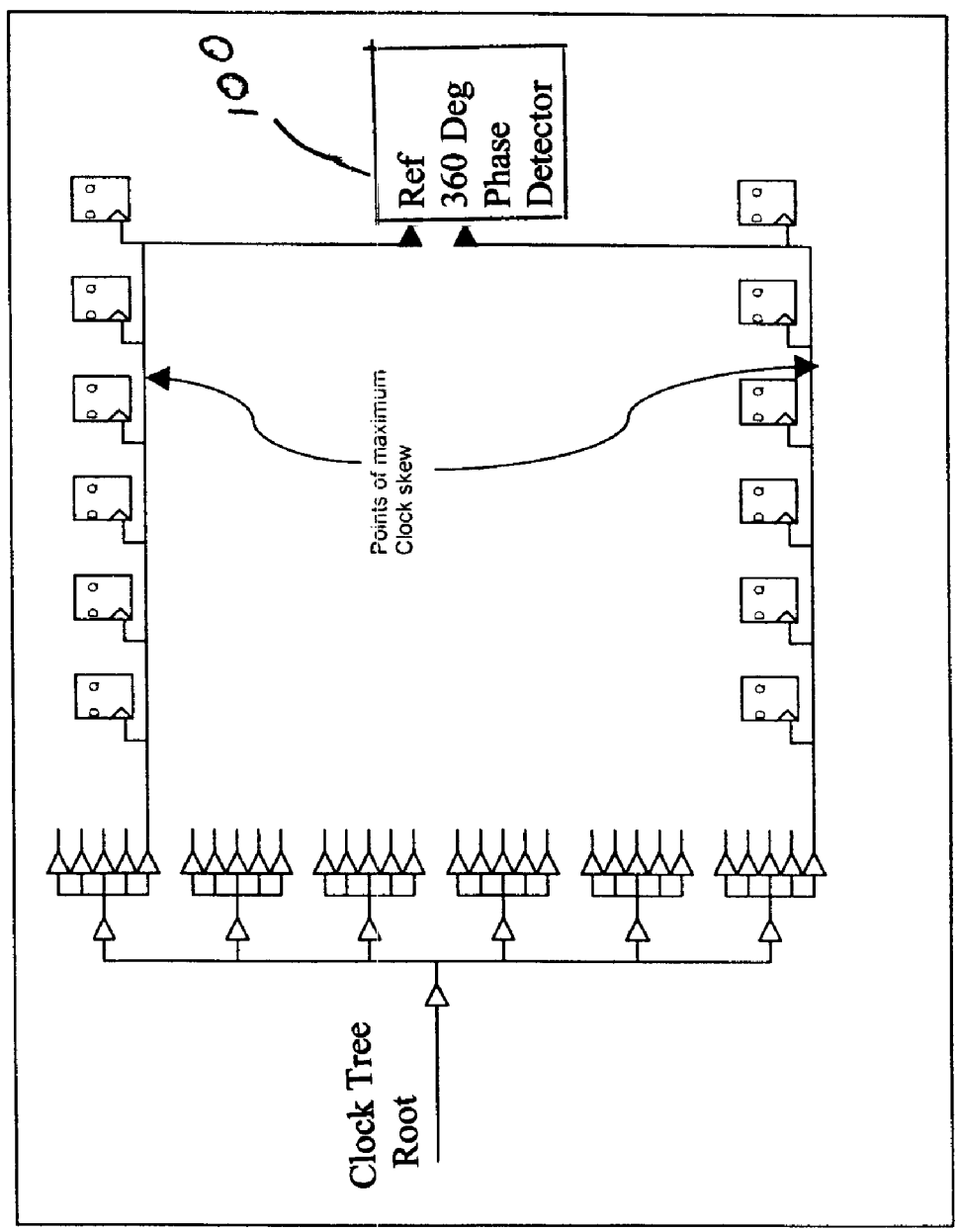
FIG. 6 is a high level block diagram illustrating the circuit of the invention testing clock tree skew.

FIG. 6 illustrates how the circuit 100 of the invention can also be used to test for clock skew in a clock tree on a chip. Points on the tree where the most skew would be expected are coupled to the respective reference and 360° inputs of the circuit 100.

There have been described and illustrated herein several embodiments of methods and apparatus for testing a DLL. While particular embodiments of the invention have been described, it is not intended that the invention be limited thereto, as it is intended that the invention be as broad in scope as the art will allow and that the specification be read likewise. Thus, while particular circuit elements have been shown, it will be appreciated that other equivalent elements may be utilized. Also, while particular exemplary values have been given for FF setup and FF hold and a particular equation has been provided, it will be appreciated that different values and a different equation may be necessary in different environments. It will therefore be appreciated by those skilled in the art that yet other modifications could be made to the provided invention without deviating from its spirit and scope as claimed.

What is claimed is:

1. A method for testing a delay locked loop (DLL) which has 90°, 180°, 270° and 360° delay outputs based on a reference clock input, said method comprising:
   delaying a first DLL output;
   comparing the delayed first DLL output with the reference clock;
   delaying the reference clock;
   comparing the delayed reference clock with the first DLL output;
   delaying a second DLL output;
   comparing the delayed second DLL output with the reference clock; and
   comparing the delayed reference clock with the second DLL output.

2. The method according to claim 1, wherein:
   the first and second DLL outputs are 180° out of phase with each other.

3. The method according to claim 2, wherein:
   the first DLL output is the 360° delay output and the second DLL output is the 180° delay output.

4. The method according to claim 1, further comprising:
   adjusting the amount of delay added to the first DLL output and the reference clock.

5. The method according to claim 4, further comprising:
performing a process monitor test, wherein
said step of adjusting is based on the results of the process monitor test.

6. The method according to claim 5, wherein:
said step of performing a process monitor test is repeated continuously.

7. The method according to claim 1, further comprising:
adjusting the amount of delay added to the first and second DLL outputs and the reference clock.

8. The method according to claim 7, further comprising:
performing a process monitor test, wherein
said step of adjusting is based on the results of the process monitor test.

9. The method according to claim 8, wherein:
said step of performing a process monitor test is repeated continuously.

* * * * *